United States Patent
Wu

(10) Patent No.: US 7,161,189 B2
(45) Date of Patent: Jan. 9, 2007

(54) LED PACKAGE INCLUDING A FRAME

(75) Inventor: Yung-Fu Wu, Chungho (TW)

(73) Assignee: Lite-On Technology Corporation, Taipei (TW)

( * ) Notice: Subject to any disclaimer, the term of this patent is extended or adjusted under 35 U.S.C. 154(b) by 0 days.

(21) Appl. No.: 11/141,023

(22) Filed: Jun. 1, 2005

(65) Prior Publication Data

US 2005/0269589 A1    Dec. 8, 2005

(30) Foreign Application Priority Data

Jun. 4, 2004    (TW) ............................... 93208887 U

(51) Int. Cl.
*H01L 27/15*    (2006.01)
(52) U.S. Cl. ..................... 257/98; 257/79; 257/E33.067
(58) Field of Classification Search ..................... None
See application file for complete search history.

(56) References Cited

U.S. PATENT DOCUMENTS 6,274,924 B1    8/2001    Carey et al.

2004/0126913 A1 *    7/2004    Loh

FOREIGN PATENT DOCUMENTS

TW    4335533 A    1/1989

* cited by examiner

*Primary Examiner*—Nathan J. Flynn
*Assistant Examiner*—Kevin Quinto
(74) *Attorney, Agent, or Firm*—Birch, Stewart, Kolasch & Birch LLP

(57) ABSTRACT

A power LED package module includes a frame, a chip heat-conductive support, a light-emitting chip and a package body. The frame has a conductive pin, and a support separated from the conductive pin and connecting to the chip heat-conductive support. The light-emitting chip is arranged on the chip heat-conducting support and electrically connected to the conductive pin. The frame, the chip heat-conducting support and the light-emitting chip are packaged via the package body. The chip heat-conducting support is partially exposed out of the package body for connecting to a heat-dissipating element for increasing the efficiency of heat dissipation of the power LED package module. The power LED package module thus provides electrical conduction and heat conduction in a split manner.

17 Claims, 10 Drawing Sheets

LED PACKAGE INCLUDING A FRAME

BACKGROUND OF THE INVENTION

1. Field of the Invention

The present invention relates to a power LED package module, and especially to a power LED package for increasing efficiency of heat dissipation and separating electrical conduction and heat conduction.

2. Description of Related Art

According to the manufacturing technology of LEDs and the increasing expansion of the application range of LEDs, it is necessary to increasingly raise the brightness of LEDs. The first method to achieve this goal is to increase the light-emitting efficiency of LEDs or photoelectrical exchange efficiency of LEDs. The second method is to increase the power of LEDs. The second method is a popular method in manufacturing. The temperature of the PN junctions is increasingly raised according to the increase of the input current in a light-emitting chip of LEDs. The excessive temperature of the PN junctions reduces the power of the light emission of LEDs. Moreover, the support of the light-emitting chip and the package body has different thermal expansion coefficients, so that the rate of the contraction and expansion are different. Therefore, the light-emitting chip bears a larger mechanical force and reduces or loses the capability of the light emission. Hence, it is important to solve the problem of heat dissipation in a LED package module for holding the PN junctions at a lower temperature.

Referring to FIG. 1, the T.W. Pat. 433553 provides a LED package heat-dissipating structure, which comprises a heat-dissipating block 10a, a conductive pin 11a, a light-emitting chip 12a, a heat-conducting pipe 13a and a package body 15a. The heat-dissipating block 10a is fixed on a bottom portion of the conductive pin 11a. The light-emitting chip 12a is arranged on a top portion of the conductive pin 11a. The heat-conducting pipe 13a is connected to a heat-dissipating body of a PCB 14a and the heat-dissipating block 10a. The heat-dissipating block 10a, a conductive pin 11a and a light-emitting chip 12a are packaged via the package body 15a.

However, the heat-dissipating block 10a is arranged on the bottom portion of the conductive pin 11a, so that electrical conduction and heat conduction occur together between the light-emitting chip 12a and the conductive pin 11a. When the LED package heat-dissipating structure is connected on the PCB 14a, the conductive pin 11a will transmit the high heat of the solder to the light-emitting chip 14a. The high heat damages the light-emitting chip 12a and reduces the lifetime.

Referring to FIG. 2, the U.S. Pat. No. 6,274,924 B1 provides another LED package heat-dissipating structure, which comprises a heat-exchanging block 20a, frame body 30a, light-emitting chip 40a, heat-conducting piece 50a and an optical lens 60a. The frame body 30a includes a metal structure with a fixed shape and a plastic structure with a receiving space. The heat-exchanging block 20a is embedded in the receiving space of the plastic structure. The light-emitting chip 40a and the heat-conducting piece 50a are respectively arranged to one another in series on the heat-exchanging block 20a. The light-emitting chip 40a is connected to a metal of the frame body 30a, and the optical lens 60a is attached on the plastic structure to form a LED package structure for separating the heat conduction and electrical conduction. As is evident, the LED package structure of related art is structurally complex, so it increases costs.

SUMMARY OF THE INVENTION

The primary object of the present invention is to provide a power LED package module. The power LED package module includes a conductive pin and a support separated from each other in order to prevent heat conduction from communicating with electrical conduction as well as to avoid conducting heat from the conductive pin to the light-emitting chip. The power LED package module further includes a package body, and a chip heat-conducting support with a part exposed outside the package body to connect with a heat-dissipating element for increasing the efficiency of the heat dissipation and lifetime. The chip heat-conducting support also has the advantages of simpler structure and cheaper cost than the related art.

In order to achieve the above objects, the present invention provides a power LED package module comprising a frame, a chip heat-conducting support, at least one light-emitting chip and a package body.

The frame has at least two conductive pins and a support. The conductive pins and the support are separated from each other. The chip heat-conducting support is connected to the support. The light-emitting chip is arranged on the chip heat-conducting support and electrically connects to the conductive pins.

The package body connects to the conductive pins, the support and the chip heat-conducting support, and the one light-emitting chip is packaged on the chip heat-conducting support. A part of the chip heat-conducting support is exposed from the package body.

Furthermore, the present invention provides a frame of a power LED package module comprising a plurality of supports, a plurality of conductive pins and a plurality of connected portions.

Each of the supports has a plurality of support pins and a plurality of ring bodies. Each of the ring bodies is connected to a side portion of the corresponding support pin. Each of the ring bodies is connected to a corresponding chip heat-conducting support. The conductive pins are parallel to the corresponding supports. Each of the connected portions is connected vertically to the corresponding support pin and corresponding two of conductive pins.

It is to be understood that both the foregoing general description and the following detailed description are exemplary, and are intended to provide further explanation of the invention as claimed. Other advantages and features of the invention will be apparent from the following description, drawings and claims.

BRIEF DESCRIPTION OF THE DRAWINGS

The various objects and advantages of the present invention will be more readily understood from the following detailed description when read in conjunction with the appended drawing, in which.

DETAILED DESCRIPTION OF PREFERRED EMBODIMENTS

Figure 1:
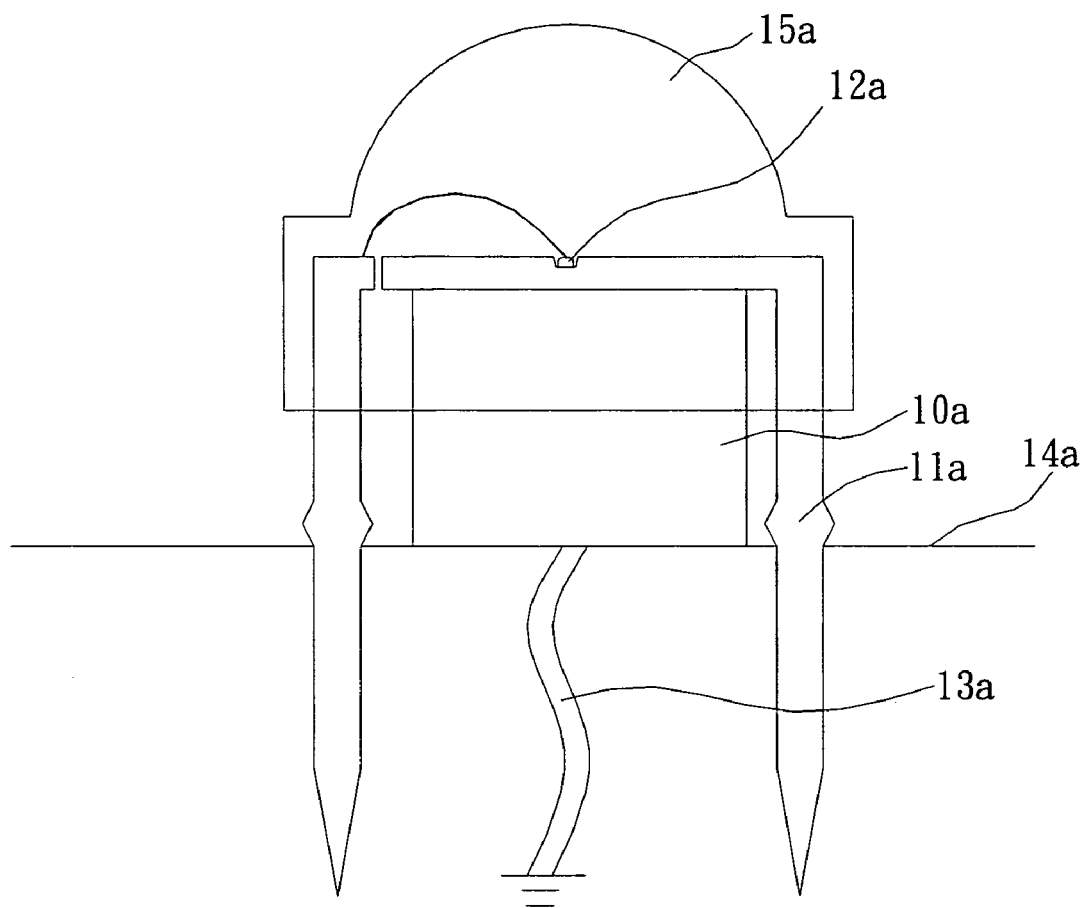
FIG. 1 is a schematic view of the power LED package module of the related art.
Figure 2:
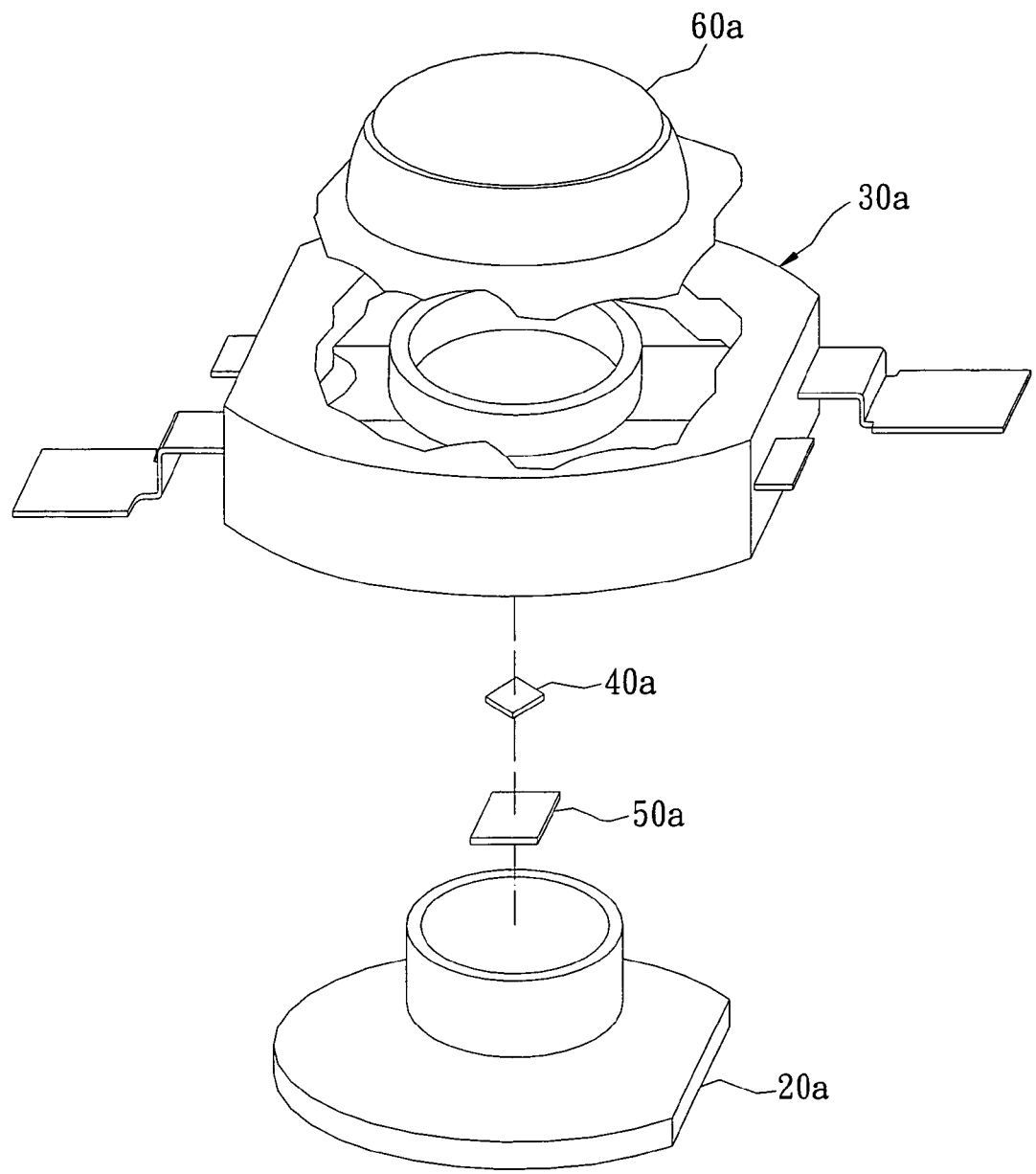
FIG. 2 is a schematic, perspective view of the power LED package module of the related art.
Figure 3:
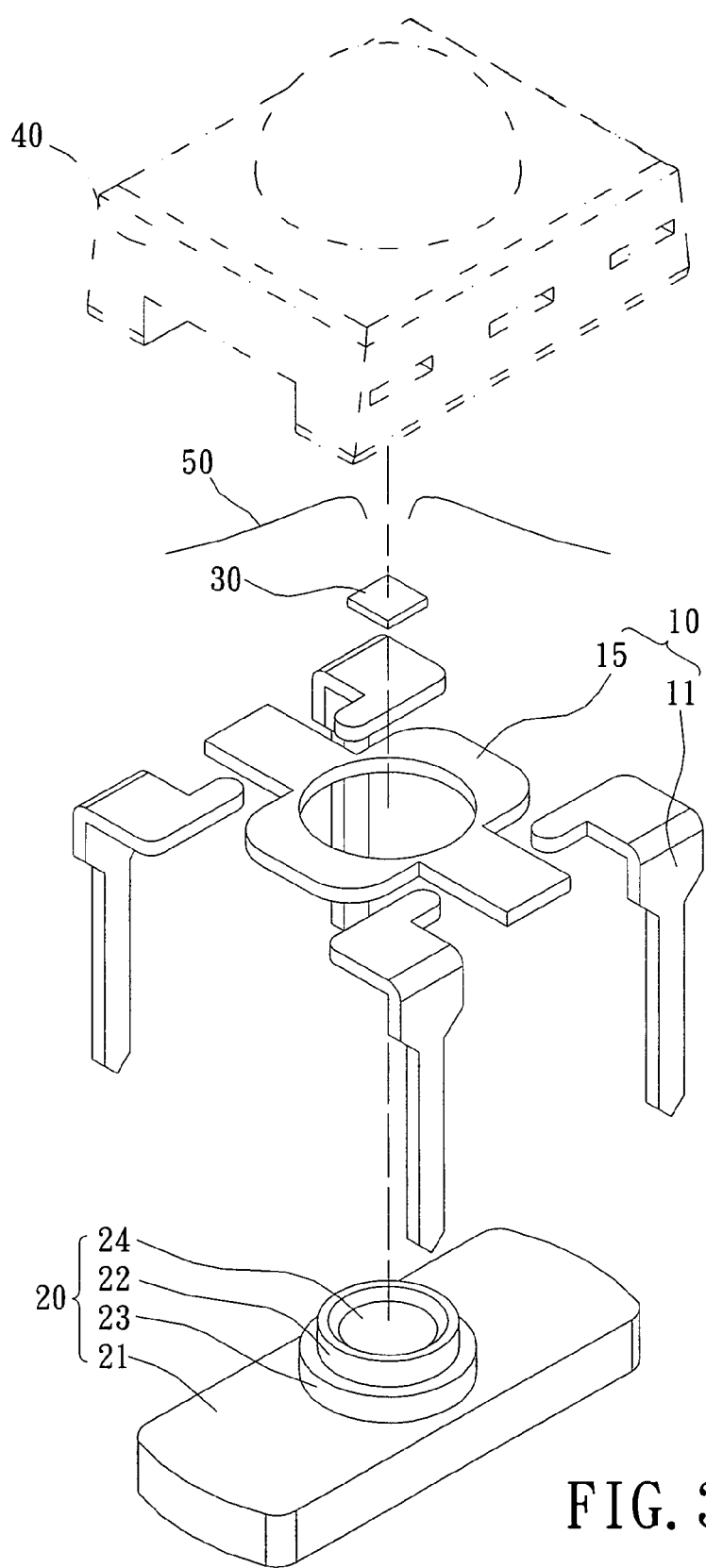
FIG. 3 is a schematic, exploded view of the power LED package module of the present invention.

Referring to FIG. 3, the present invention provides a power LED package module. The power LED package module includes a frame 10, a chip heat-conducting support 20, a light-emitting chip 30 and a package body 40. The frame 10 has four conductive pins 11 and a support 15. The light-emitting chip 30 is arranged on the chip heat-conducting support 20. The chip heat-conducting support 20 connects with the support 15. The package body 40 is disposed on the four conductive pins 11, the support 15 and the chip heat-conducting support 20, in order to package the light-emitting chip 30 on the chip heat-conducting support 20 and expose a part of the chip heat-conducting support 20. Then, when the power LED package module electrically connects to a PCB, the exposure of the part of the chip heat-conducting support 20 contacts against the PCB or a heat-dissipating device for increasing the efficiency of heat dissipation. The four conductive pins 11 and the support 15 are separated from each other for avoiding heat dissipation and electric conduction in the same passageway, and increasing the life of the light-emitting chip 30 by avoiding the heat conducted to the light-emitting chip 30. The chip heat-conducting support 20 with a larger volume has a larger heat capacity for reducing the effect of sudden heat shock, when external temperature is raised suddenly.

Figure 4:
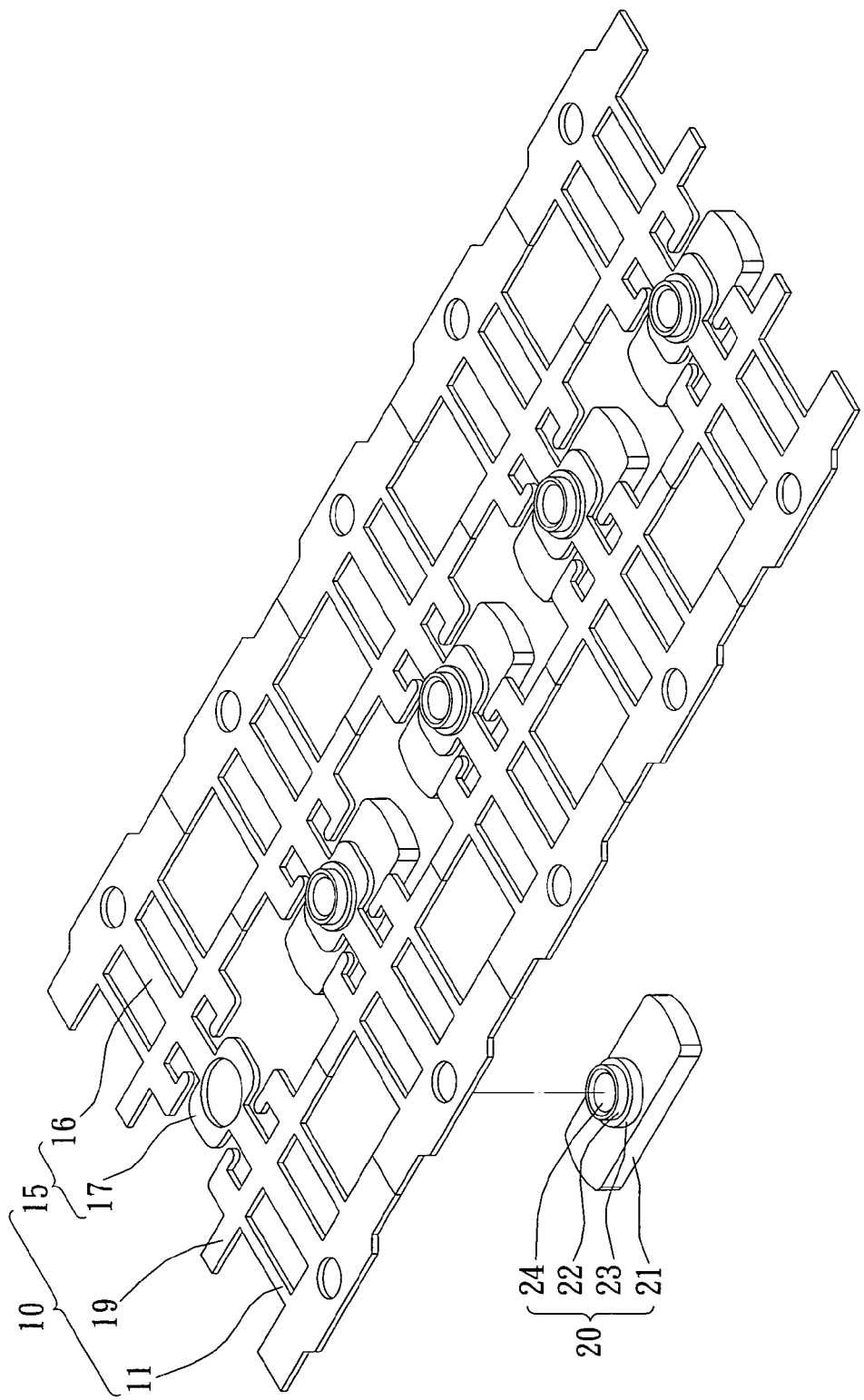
FIG. 4 is a perspective view illustrating the frame and the heat-conducting support assembled together according to one embodiment of the present invention.

Referring to FIG. 4, the present invention provides a plurality of frames 10. Each of the frames 10 is a flat frame, and has four conductive pins 11, a support 15 and a connected portion 19. The support 15 has two support pins 16, and a ring body 17 that is connected to the two support pins 16. The two support pins 16 are arranged on two opposite sides of the ring body 17, and every two of the four conductive pins 11 are correspondingly arranged on two opposite sides of the support pin 16. Every two of the four conductive pins 11 and the corresponding support pin 16 are connected together by the connected portion 19. The chip heat-conducting support 20 includes a heat-conducting body 21, a projected portion 22, a ring protrusion 23, and a concave light-reflecting portion 24. The projected portion 22 is projected from a topside of the heat-conducting body 21. The concave light-reflecting portion 24 is formed on a topside of the projected portion 22. The ring protrusion 23 surrounds external edge of the projected portion 22. The heat-conducting body 21 can be a rectangular shape. The ring body 17 of the support 15 surrounds the external edge of the ring protrusion 23 and contacts against the topside of the heat-conducting body 21.

Referring to FIGS. 3 and 4, firstly the light-emitting chip 30 is received in the concave light-reflecting portion 24 of the chip heat-conducting support 20. Then, the light-emitting chip 30 is electrically connected to two of the four conductive pins 11 by two conductive wires 50, respectively. Moreover, the package body 40 is glued on the four conductive pins 11, the support 15 and the chip heat-conducting support 20, in order to package the light-emitting chip 30 on the concave light-reflecting portion 24 of the chip heat-conducting support 20, and expose a bottom portion and a side portion of the heat-conducting body 21. The four conductive pins 11 are exposed outside the package body 40. Furthermore, the package body 40 has a protruding optical lens corresponding to the light-emitting chip 30. Finally, the connected portion 19 and a part of the support pins 16 that is exposed outside the package body 40 are cut.

Figure 5:
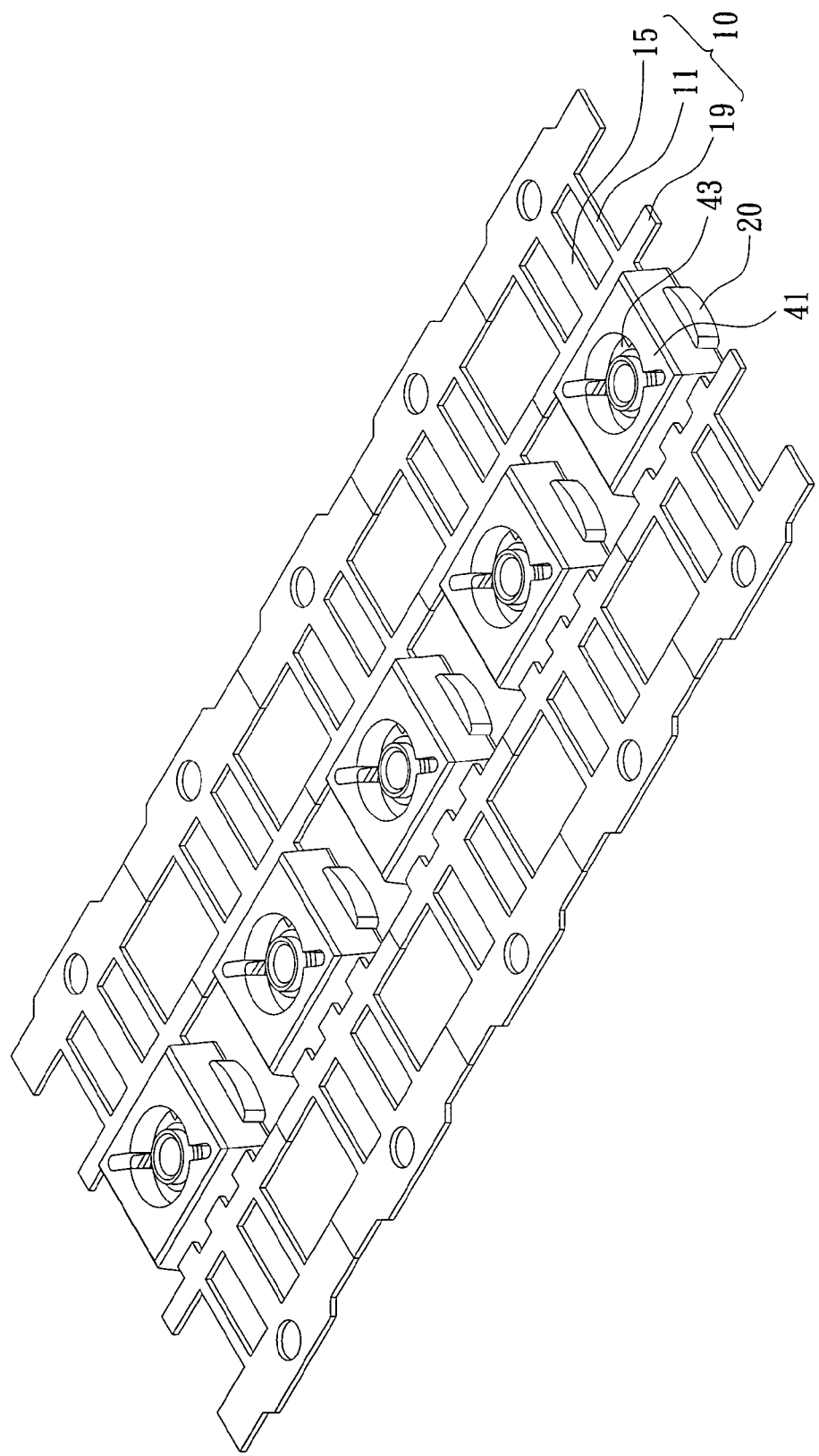
FIG. 5 is a perspective view of when the frame and the heat-conducting support are assembled together and packaged via the package body according to the present invention.
Figure 6:
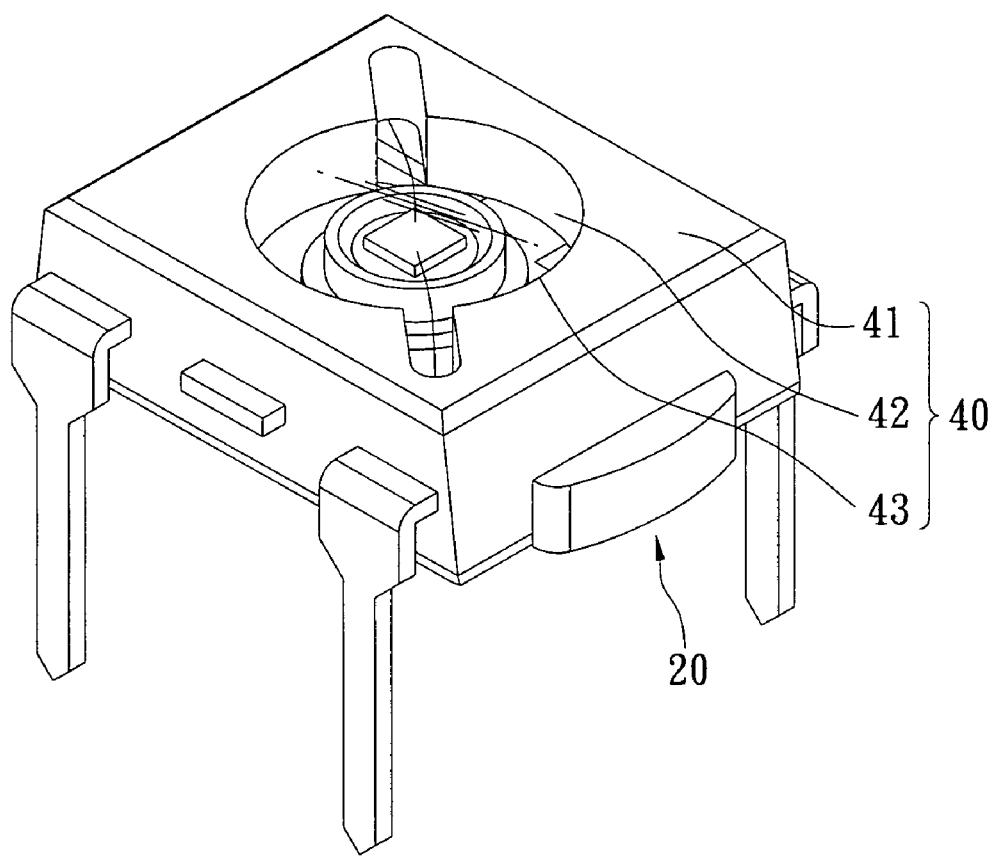
FIG. 6 is a schematic, assembled view of the power LED package module according to the present invention.

Referring to FIGS. 5 and 6, the package body 40 includes a light-nonpenetrating portion 41 and a light-penetrating portion 42. Firstly, the chip heat-conductive support 20 and the support 15 are fixed to each other by machine. Then the conductive pins 11, the support 15 and the chip heat-conductive support 20 are packaged by an impenetrable package colloid to form the light-nonpenetrating portion 41 to expose of a part of the heat-conductive support 20. The package body 40 has a receiving portion 43 formed on the light-penetrating portion 42. Moreover, the light-emitting chip 30 on the heat-conductive support 20 and the conductive pins 11 are exposed for easy welding work. Finally, the receiving portion 43 is filled with a penetrable package colloid to form the light-penetrating portion 42 and a protruding optical lens.

Figure 7:
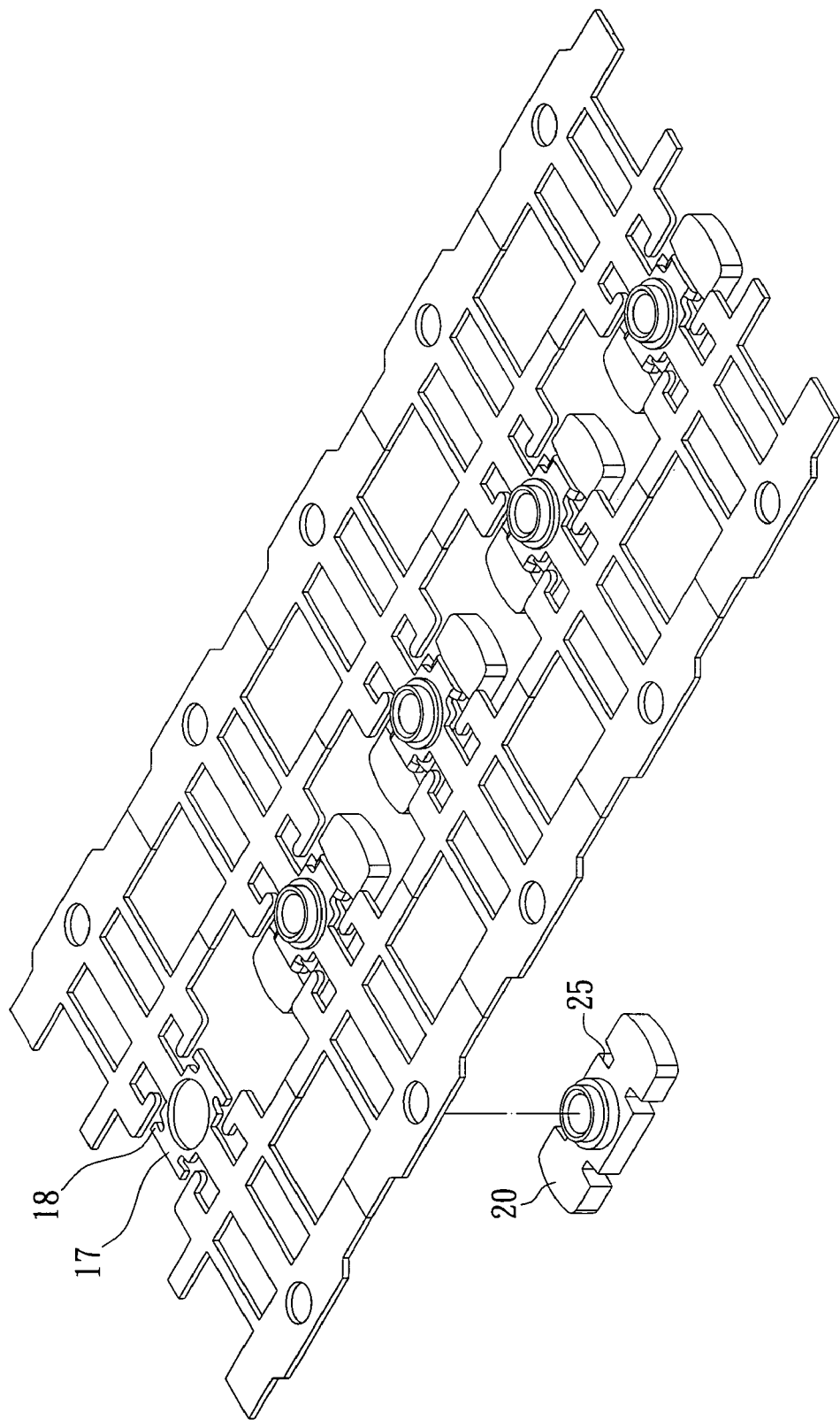
FIG. 7 is a perspective view illustrating the frame and the heat-conducting support assembled together according to another embodiment of the present invention.

Referring to FIG. 7, the chip heat-conducting support 20 is made of at least one material such as copper, aluminum, silver, diamond, silicon, molybdenum or aluminum oxide. The chip heat-conducting support 20 further includes two concaves 25 formed at each of the two opposite sides thereof. The ring body 17 has two clamping pieces 18 formed at each of the other two opposite sides thereof and corresponding to the two concaves 25. The chip heat-conductive support 20 and the support 15 are fixed to each other by machine or are glued manually. Then, the clamping pieces 18 are bent and clamped to the corresponding concaves 25 of the chip heat-conductive support 20.

Figure 8:
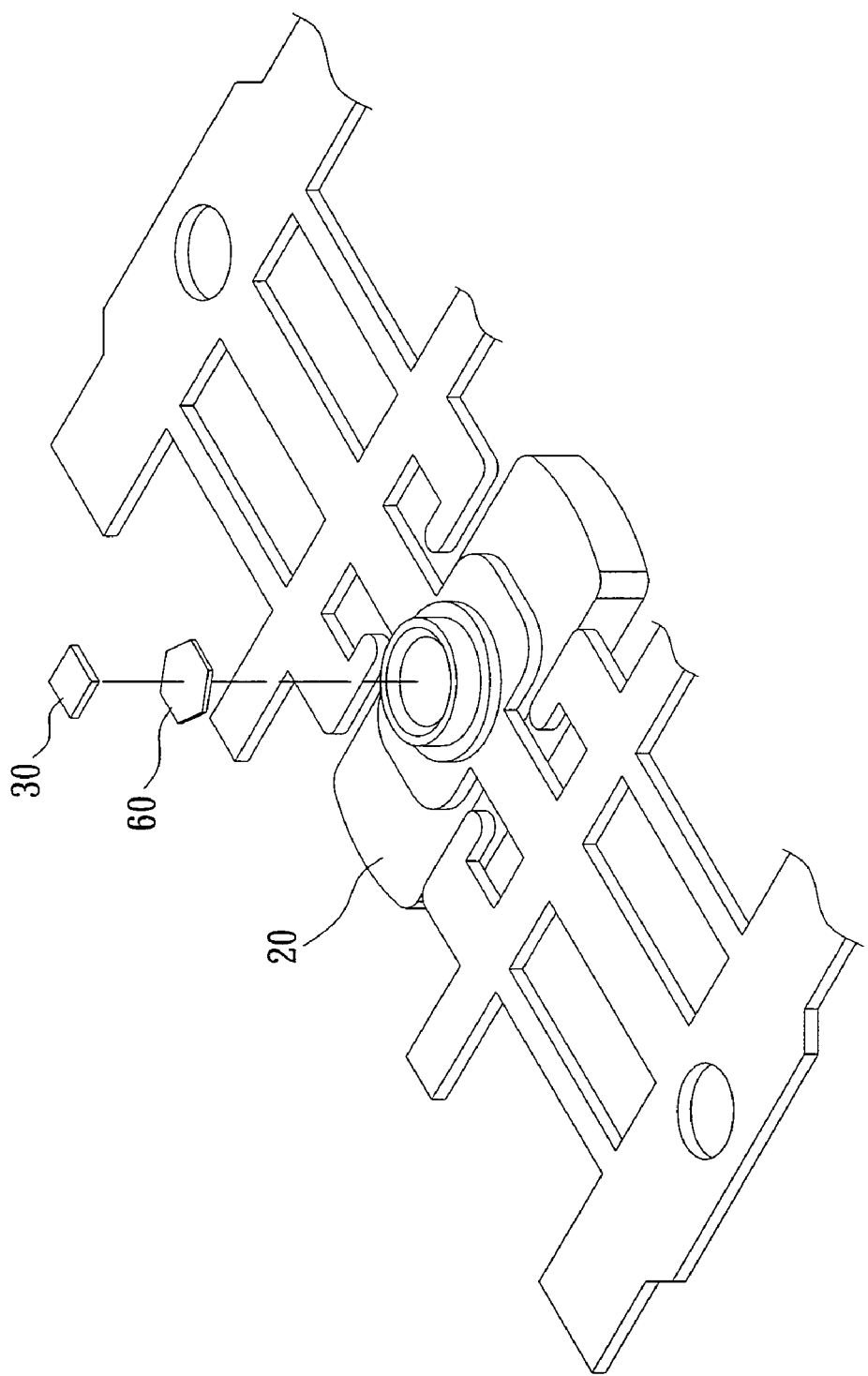
FIG. 8 is schematic, exploded view of when the light-emitting chip and the heat-conducting board are stacked on the heat-conducting support according to the present invention.

Referring to FIG. 8, the present invention further comprises a heat-conducting board 60 arranged between the chip heat-conducting support 20 and the light-emitting chip 30 for conducting effectively heat from the light-emitting chip 30 to the chip heat-conducting support 20.

Figure 9:
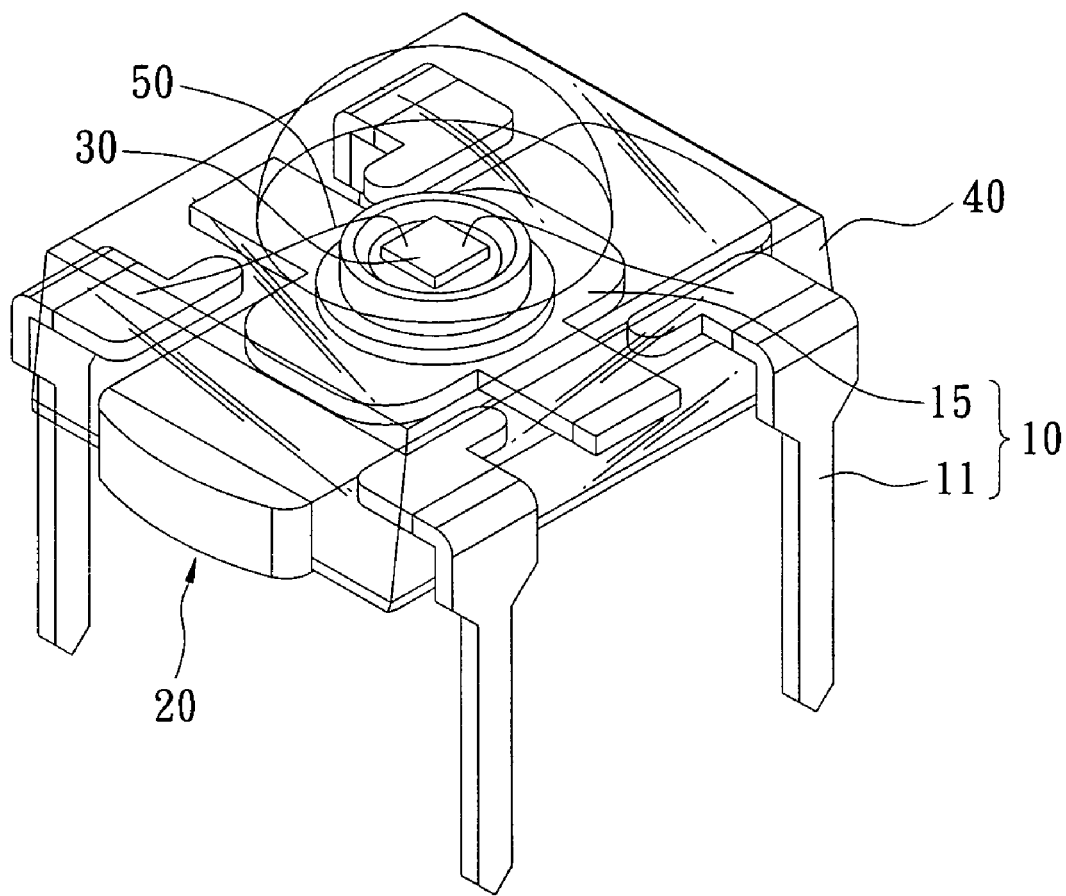
FIG. 9 is a schematic, assembled view of the power LED package module according to a first embodiment of the present invention.
Figure 10:
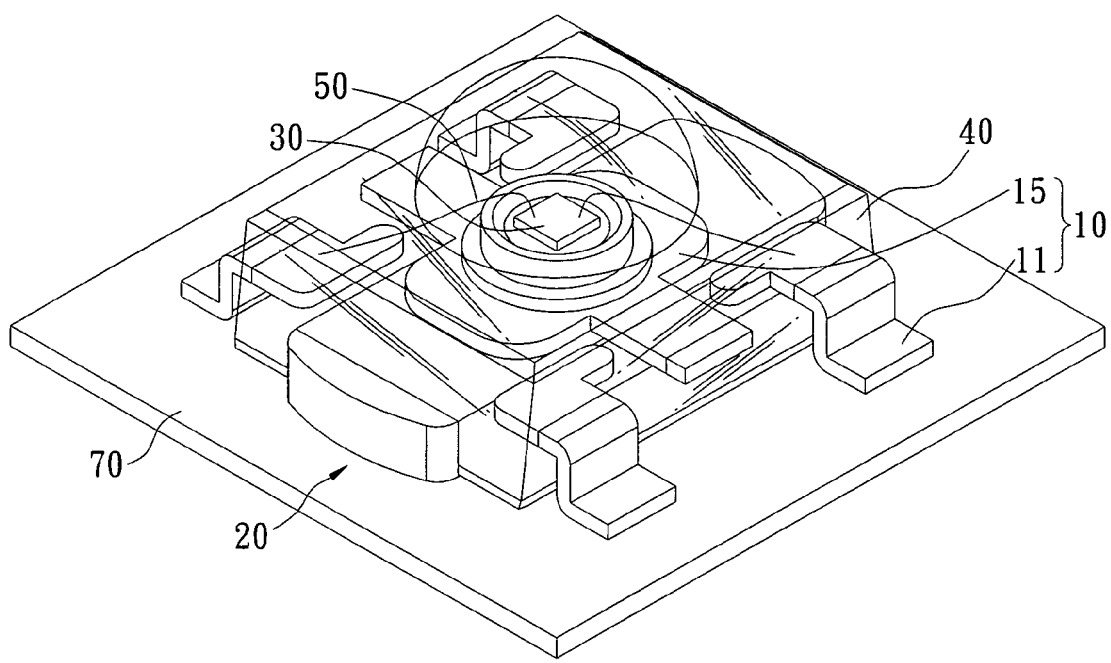
FIG. 10 is a schematic, assembled view of the power LED package module according to a second embodiment of the present invention.

Referring to FIGS. 9 and 10, there are two embodiments of the present invention. Each of the four conductive pins 11 has a part that is exposed outside the package body 40, and the exposed parts are bended to form four inserted type pins that are perpendicular to the bottom face of the package body 40 (as in FIG. 9), or to form four surface attachment type pins with L-shapes (as in FIG. 10) for connecting to the PCB 70.

Referring to FIG. 10, the chip heat-conducting support 20 has a bottom face that is contacted against a heat-dissipating device, such as the PCB 70 or a heat-dissipating element. Hence the chip heat-conducting support 20 can be used to reduce the effect of sudden heat shock, when the external temperature is raised suddenly.

Although the present invention has been described with reference to the preferred embodiment thereof, it will be understood that the invention is not limited to the details thereof. Various substitutions and modifications have been suggested in the foregoing description, and other will occur to those of ordinary skill in the art. Therefore, all such substitutions and modifications are intended to be embraced within the scope of the invention as defined in the appended claims.

What is claimed is:

1. A power LED package module comprising:
   a frame having two conductive pins and a support separated from the two conductive pins;
   a chip heat-conducting support connecting to the support;
   at least one light-emitting chip arranged on the chip heat-conducting support, and electrically connecting to the two conductive pins; and
   a package body connecting to the two conductive pins, the support and the chip heat-conducting support, wherein the at least one light-emitting chip is packaged on the chip heat-conducting support via the package body, and the chip heat-conducting support has a part exposed from the package body;
   wherein the chip heat-conducting support has a concave light-reflecting portion, and the light-emitting chip is arranged on the concave light-reflecting portion.

2. The power LED package module as claimed in claim 1, further comprising at least two conductive wires electrically connecting to the light-emitting chip and the two conductive pins, respectively.

3. The power LED package module as claimed in claim 1, wherein the chip heat-conducting support further comprising a projected portion and a ring protrusion;
   wherein the projected portion is projected from a topside of the chip heat-conducting support;
   wherein the concave light-reflecting portion is formed on a top side of the projected portion;
   wherein the ring protrusion surrounds an external edge of the projected portion; and
   wherein the support has a ring body surrounding an external edge of the ring protrusion for contacting against a top side of the heat-conducting body.

4. The power LED package module as claimed in claim 1, wherein the support and the chip heat-conducting support are clamped together.

5. The power LED package module as claimed in claim 1, wherein the chip heat-conducting support has a side portion exposed outside the package body.

6. The power LED package module as claimed in claim 1, wherein each of the two conductive pins has a part exposed outside, the package body to form an inserted type pin.

7. The power LED package module as claimed in claim 1, wherein each of the two conductive pins has a part exposed outside the package body to form a surface attachment type pin.

8. The power LED package module as claimed in claim 1, wherein the chip heat-conducting support has at least one concave formed thereon, the support has at least one clamping piece formed thereon, and the at least one clamping piece is embedded in the at least one concave.

9. The power LED package module as claimed in claim 1, further comprising a heat-conducting board arranged between the at least one light-emitting chip and the chip heat-conducting support.

10. The power LED package module as claimed in claim 1, wherein the chip heat-conducting support is made of at least one material selecting from copper, aluminum, silver, diamond, silicon, molybdenum or aluminum oxide.

11. The power LED package module as claimed in claim 1, wherein the chip heat-conducting support has a bottom face exposed outside the package body to contact against a heat-dissipating device.

12. The power LED package module as claimed in claim 11, wherein the heat-dissipating device is a PCB or a heat-dissipating element.

13. The power LED package module as claimed in claim 1, wherein the package body includes a light-nonpenetrating portion, and a light-penetrating portion connecting to the two conductive pins, the support and the chip heat-conductive support, wherein the at least one light-emitting chip are packaged on the chip heat-conducting support corresponding to the light-penetrating portion.

14. The power LED package module as claimed in claim 13, wherein the light-penetrating portion is a protruding optical lens corresponding to the light-emitting chip.

15. A blank for a frame of a power LED package module comprising:
   a plurality of supports, each of the supports having at least one support pin and a ring body, the ring body being connected to a side portion of the corresponding support pin, and the ring body being connected to a corresponding chip heat-conducting support;
   a plurality of conductive pins parallel to the corresponding supports; and
   a plurality of connected portions, each of the connected portions connected perpendicularly to the corresponding support pins and the corresponding two conductive pins;
   said supports, support pins, ring body, conductive pins and connected portions being arranged in a plane.

16. A blank for the frame of a power LED package module as claimed in claim 15, wherein the conductive pins are correspondingly arranged on two opposite sides of the ring body, the support pins are correspondingly arranged on the two opposite sides of the ring body and parallel to the corresponding conductive pins.

17. A blank for the frame of a power LED package module as claimed in claim 15, wherein the ring body has a ring shape.

* * * * *